(12) United States Patent
Farmiga et al.

(10) Patent No.: US 7,209,499 B2
(45) Date of Patent: Apr. 24, 2007

(54) MODE-SELECTIVE FREQUENCY TUNING SYSTEM

(75) Inventors: Nestor Farmiga, Rochester, NY (US); Andrew W. Kulawiec, Fairport, NY (US); Joseph Marron, Pittsford, NY (US); Thomas J. Dunn, Penfield, NY (US)

(73) Assignee: Corning Incorporated, Corning, NY (US)

( * ) Notice: Subject to any disclaimer, the term of this patent is extended or adjusted under 35 U.S.C. 154(b) by 261 days.

(21) Appl. No.: 10/946,692

(22) Filed: Sep. 22, 2004

(65) Prior Publication Data
US 2006/0062261 A1  Mar. 23, 2006

(51) Int. Cl.
*H01S 3/10* (2006.01)

(52) U.S. Cl. .............................. 372/20; 372/28; 372/32

(58) Field of Classification Search .................. 327/20; 372/28, 32, 20
See application file for complete search history.

(56) References Cited

U.S. PATENT DOCUMENTS

| | | | |
|---|---|---|---|
| 6,233,263 B1 * | 5/2001 | Chang-Hasnain et al. | 372/32 |
| 6,690,690 B2 | 2/2004 | Marron | 372/20 |
| 2004/0033022 A1 * | 2/2004 | Althaus et al. | 385/37 |

* cited by examiner

*Primary Examiner*—Dung (Michael) T. Nguyen
(74) *Attorney, Agent, or Firm*—Timothy M. Schaeberle

(57) ABSTRACT

A frequency tuning system for a laser includes mode-matched lasing and feedback cavities. A reflective facet of the feedback cavity is adjustable for retroreflecting different feedback frequencies to the lasing cavity without changing a fixed length of the feedback cavity. A selection among resonant frequencies of the feedback cavity provides for tuning the laser through discrete resonant frequencies of the lasing cavity.

26 Claims, 2 Drawing Sheets

MODE-SELECTIVE FREQUENCY TUNING SYSTEM

BACKGROUND OF THE INVENTION

1. Field of the Invention

Tunable lasers and systems for regulating the frequency output of monochromatic light sources find new expression in the invention, particularly for such purposes as frequency-shifting interferometry where interference patterns are produced at multiple measuring beam frequencies.

2. Description of Related Art

Light resonates within laser cavities between front and back facets in distinct frequency modes at which standing waves are produced by complete round trips taken by integer numbers of wavelengths between the facets. The potential for gain within the laser cavities varies as a function of frequency, and the optical power tends to concentrate in the frequency mode experiencing the highest gain or conversely the lowest loss. Beyond encounters with a lasing medium within the laser cavities, most other encounters of the light within the laser cavities entail losses, and the mode frequency experiencing the lowest loss is generally the one most amplified by the laser.

Frequency tuning of laser sources generally involves adjusting the conditions under which light is oscillated within the laser cavity to alter the nominal frequency that experiences the lowest loss. One way this is done is by coupling the output of the laser to an adjoining cavity that further participates in the oscillation of light. The external cavity includes the original cavity, which is filled with the gain medium and is referred to as "the lasing cavity", and the adjoining cavity, which is not so filled and is referred to as "the feedback cavity".

According to a so-called "Littrow" cavity configuration, the feedback cavity includes an adjustable facet in the form of a diffraction grating that diffracts one portion of the light (through a first order) on a path of retroreflection back toward the lasing cavity and reflects another portion of the light (through the zero order) in a second direction as the laser output. The lasing and feedback cavities are coupled together through a collimating lens, which collimates the light emitted through an active area on the front facet of the lasing cavity. The angle at which light is diffracted from the grating varies as a function of frequency. Of the diffracted light, only a limited band of frequencies are sufficiently aligned with the path of retroreflection to be focused by the collimating lens onto the active area of the front facet for reentry into the lasing cavity. By controlling the inclination of the diffraction grating, the frequencies capable of being retroreflected back into the lasing cavity can be adjusted.

The frequencies available for diffraction by the diffraction grating are limited to those that are amplified and emitted from the lasing cavity. The effect of returning any of the emitted frequencies to the lasing cavity is to alter the relative amounts of loss experienced among the emitted frequencies. A larger effect on the loss profile is produced by returning frequencies that are also capable of oscillating throughout the combined lengths of the lasing and feedback cavities with constructive interference. Losses are further reduced by the more limited set of frequencies that also constructively interfere between ends of the feedback cavity (i.e., between the front facet of the lasing cavity and the diffraction grating) by returning light to the lasing cavity at the same phase that the light left the lasing cavity. The frequency modes of the feedback cavity are generally more closely spaced than those of the lasing cavity.

Attempts to vary the frequency output of the laser cavities over a continuum are complicated by the effects of interference, which favors the oscillation of certain frequencies over others. To accommodate the effects of constructive interference generated by the feedback cavity, the gratings are generally translated in addition to being inclined through a range of angles so that the frequencies at which constructive interference takes place change with the frequencies that are retroreflected from the grating. However, if the front facet of the lasing cavity is highly reflective, the constructive interference within the lasing cavity still favors certain frequencies over others and as a consequence presents a risk of mode hopping, where abrupt changes in output frequency accompany much finer changes in feedback frequency. Often tuning is limited to frequency tolerance variations within a single lasing cavity mode.

BRIEF SUMMARY OF THE INVENTION

According to one or more of the preferred embodiments, the mode preference of a feedback cavity is matched to the mode preference of an adjoining lasing cavity to provide a discrete frequency tuning system for selecting among the frequency modes of the lasing cavity. The lengths of both the lasing and feedback cavities are fixed, and the mode spacings of the two cavities are related by an integer multiple. A frequency adjuster, which is preferably located at one end of the feedback cavity, makes the frequency selections without changing the length of either cavity. The conditions for constructive interference remain fixed within both the lasing and feedback cavities, favoring the amplification of certain discrete frequencies.

One example of the invention as a frequency tuning system includes a laser having both a lasing cavity and a feedback cavity along an optical axis. The lasing cavity, which has a first fixed optical path length along the optical axis, contains a lasing medium for amplifying a range of frequencies. The feedback cavity, which has a second fixed optical path length along the optical axis, is optically coupled to the lasing cavity. The lasing cavity favors an amplification of frequencies that (a) are within the range of frequencies amplified by the lasing medium and (b) have integer numbers of wavelengths spanning a distance of two times the first optical path length of the lasing cavity. The feedback cavity favors the coupling of frequencies with the lasing cavity having integer numbers of wavelengths spanning a distance of two times the second optical path length of the feedback cavity. At least some of the frequencies favored by the lasing cavity for amplification corresponding to the frequencies favored by the feedback cavity for coupling with the lasing cavity. A frequency adjuster selects among the corresponding frequencies for shifting a frequency output of the laser through discrete frequency increments at the fixed optical path length of the feedback cavity.

The frequency adjuster preferably includes a reflective facet that is pivotable about a pivot axis that intersects the optical axis of the feedback cavity, so that changes in the inclination of the reflective facet do not significantly affect the fixed optical path length of the feedback cavity. The reflective facet preferably includes a diffraction grating that angularly disperses incident light as a function of its frequency. The frequency adjuster pivots the diffraction grating about the pivot axis for selectively reflecting different wavelengths of light along the optical axis. An angularly sensitive optical coupling between the lasing and feedback cavities favors the coupling of light directed along the optical axis.

The angular variations in the inclination of the grating select among the preferably more numerous frequency modes of the feedback cavity. A tolerance for inclination angle errors can be accommodated because the effects of constructive interference within the feedback cavity favor a limited set of frequencies for feedback, and the constructive interference within the lasing cavity favors a further limited set of frequencies that are readily distinguished from one another by a choice among the favored feedback frequencies.

Another example of a frequency tuning system for a laser includes an external cavity having a fixed optical path length. The external cavity includes optically coupled lasing and feedback cavities, each extending a fixed optical path length between their opposite ends. The lasing cavity contains a lasing medium, and the lasing and feedback cavities support oscillating modes in common corresponding to frequencies whose wavelengths are even divisions of two times their fixed optical path lengths of travel between the opposite ends of both of the cavities. A frequency adjuster selects among the common oscillating modes without altering the fixed optical path length of the external cavity.

Twice the fixed optical path length of travel between the opposite ends of the lasing cavity is a first integer multiple of one of the wavelengths of the common oscillating modes, and twice the fixed optical path length of travel between the opposite ends of the feedback cavity is a second integer multiple of the same one of the wavelengths of the common oscillating modes. Preferably, one of the first and second integer multiples is an integer multiple of the other so that other modes of the feedback cavity correspond to other modes of the lasing cavity.

The properties of interference within laser cavities are exploited for favoring the amplification of mode frequencies having wavelengths that form standing waves between opposite ends of both cavities. The modes of the lasing cavity are by nature substantially equally spaced. Optical feedback from the appended feedback cavity having a fixed optical path length provides for selecting among the different frequency modes of the lasing cavity for tuning the laser through predetermined frequency steps.

The invention provides for the frequency tuning of lasers by discrete steps, which is distinguished from the usual objectives for laser tuning over a continuum of frequencies. As such, the invention is particularly applicable to frequency-shifting interferometers also referred to as multi-wavelength interferometers, which acquire path length information between interfering beams by shifting the interfering beams through a sequence of frequencies. Continuous tuning generally requires suppression of the natural frequency modes of the lasing cavity by reducing reflectivity of the lasing cavity's front facet. The discrete tuning favored by the invention allows for commercially available lasers, including laser diodes, to be used without such facet modifications.

Since the tuning takes place through predetermined increments corresponding to the natural resonances of the external laser cavity, a wider tolerance for the angular position of the feedback grating can be accommodated because feedback frequencies that do not correspond to the natural resonances of the external laser cavity are suppressed by destructive interference. The even mode spacing of the favored lasing frequencies simplifies frequency monitoring because the frequencies can be monitored in steps (e.g., corresponding to a free spectral range of a measuring cavity) rather then through more continuous changes.

BRIEF DESCRIPTION OF THE SEVERAL VIEWS OF THE DRAWING(S)

FIG. 1 is diagram of an external cavity laser in accordance with the invention having fixed length lasing and feedback cavities FIG. 2 is a diagram showing optical path lengths of the lasing and feedback cavities of a laser with matching modes within both cavities.

FIG. 3 a plot of gain over a domain of frequency for a lasing cavity schematically showing the available frequency modes under a curve of potential gain.

DETAILED DESCRIPTION OF THE INVENTION

Figure 1:
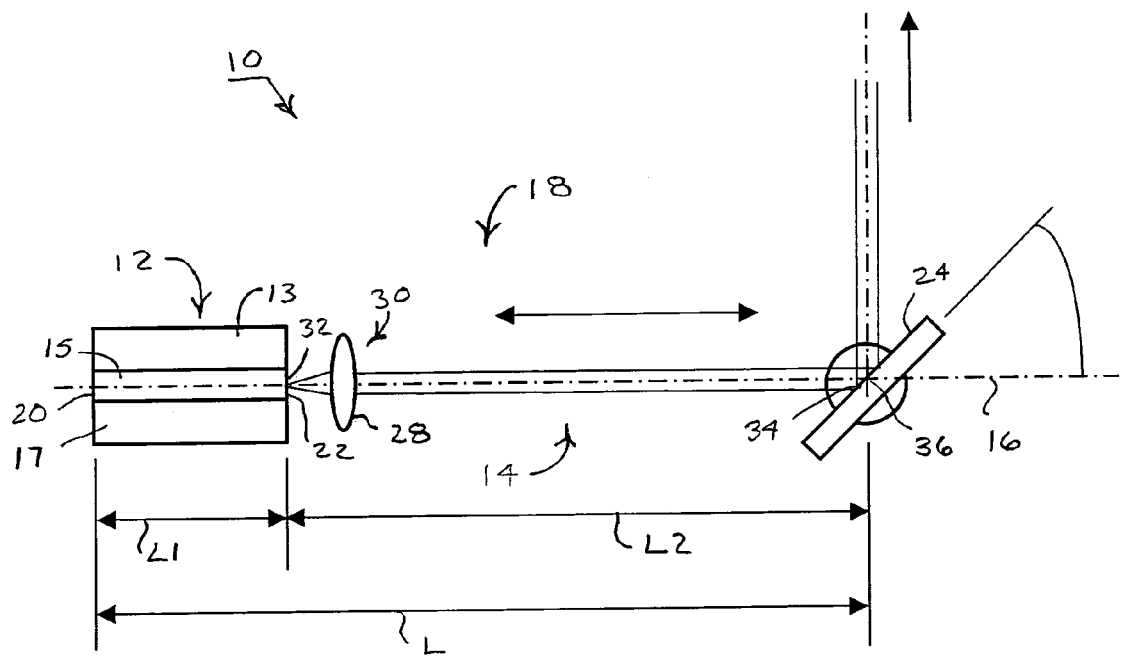

As shown in FIG. 1 a laser 10, which is preferably a semiconductor diode laser, includes in accordance with the invention a lasing cavity 12 and an adjoining feedback cavity 14 aligned along a common optical axis 16. Together, the two cavities 12 and 14 form an external cavity 18.

The lasing cavity 12 contains a lasing medium (an active layer) 15 sandwiched between two electrically biased regions 13 and 17 (e.g., p and n regions) and has a fixed optical path length L1 along the optical axis 16 between a reflective back facet 20 and a reflective front facet 22 located at opposite ends of the lasing cavity 12. The gain is such for conventional laser diodes that the front facet 22 requires only a small reflectivity (e.g., approximately 4 percent) to support resonant frequency modes. The feedback cavity 14, which is exposed to ambient air, has a fixed optical path length L2 between the front facet 22 of the lasing cavity and a pivotable reflective facet 24 located at an opposite end of the feedback cavity 14. A collimating lens 28 forms an optical coupling 30 between the lasing and feedback cavities 12 and 14 through an active area 32 of the front facet 22.

The pivotable facet 24 includes a diffraction grating 34 that reflects one order of diffraction, preferably the first order, back toward the lasing cavity 12 and that reflects another order of diffraction, preferably the zero order, beyond the feedback cavity 14 as the laser output. Within the preferred first order of diffraction, the diffraction grating 34 angularly disperses incident light according to its frequency, such that a single frequency of light is retroreflected back along the optical axis 16 to the optical coupling 30. However, the diffraction grating 34 is pivotable together with the facet 24 about a pivot axis 36 through a pivot angle θ so that a range of different frequencies can be retroreflected along the optical axis. A folding mirror (not shown) moves together with the diffraction grating 34 to maintain a single output direction for the laser output. Such folding mirrors are shown in U.S. Pat. No. 6,690,690, entitled TUNABLE LASER SYSTEM HAVING AN ADJUSTABLE EXTERNAL CAVITY, which is hereby incorporated by reference.

Although other frequencies are reflected in the general direction of the optical coupler 30, only light that is substantially collimated along the optical axis 16 is coupled to the lasing cavity 12 through the limited active area 32. Neighboring frequencies that are angularly dispersed by the diffraction grating 34 from the optical axis 16 converge elsewhere, not upon the limited active area 32 of the optical coupler 30. The free spectral range of the diffraction grating 34 is preferably beyond the tunable range of the laser 10 so that each frequency within the tunable range of the laser 10 is diffracted through a unique angle at which the diffraction grating 34 can be pivoted.

The pivot axis 36, which extends through a reflective face of the diffraction grating 34, intersects the optical axis 16 so that angular movement of the diffraction grating 34 about the pivot axis 36 does not change the optical path length L2 of the feedback cavity 14. Thus, the diffraction grating can be pivoted through a range of angles θ for controlling the frequency of light that is retroreflected along the optical axis 16 within the feedback cavity 14. The optical coupler 30 limits the coupling of light from the feedback cavity 14 to the lasing cavity 12 to retroreflections along the optical axis 16. Together, the pivotable diffraction grating 34 and the optical coupling 30 control the frequencies that can be returned to the lasing cavity 12.

Figure 2:
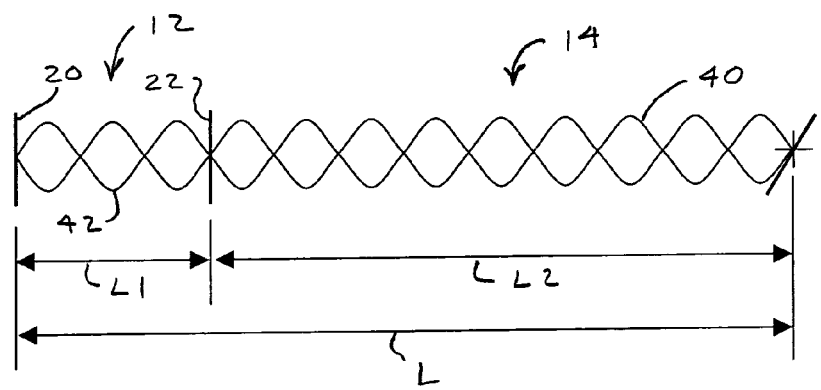

The fixed optical path length L2 of the feedback cavity 14 as shown in FIG. 2 supports the resonance of certain among the tunable frequencies as standing waves 40. The resonant frequencies or modes of the feedback cavity 14 correspond to frequencies whose wavelengths evenly divide the round-trip optical path length of the feedback cavity 14. In other words, twice the optical path length L2 equals an integer multiple N2 of the resonant frequencies or modes of the feedback cavity 14. The propagation of other frequencies within the feedback cavity 14 is suppressed by interference. Thus, among the frequencies retroreflected by the angular position of the diffraction grating 34, the resonant frequencies or modes of the feedback cavity 14 propagate at the highest amplitudes.

Figure 3:
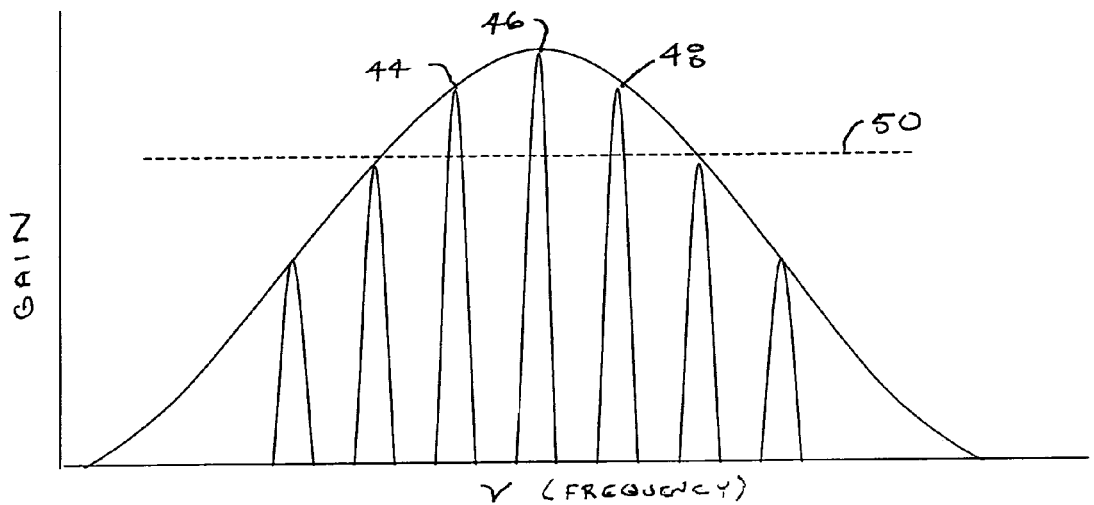

Similarly, the fixed optical path length L1 of the lasing cavity supports resonance among certain frequencies that are subject to amplification by the lasing medium 15 as standing waves 42. The resonant frequencies or modes of the lasing cavity 12 correspond to frequencies whose wavelengths evenly divide the round-trip optical path length of the lasing cavity 12. In other words, twice the optical path length L1 equals an integer multiple N1 of the resonant frequencies or modes of the lasing cavity 12. As shown in FIG. 3, frequencies capable of acquiring the highest amplitude in the lasing cavity 12 are the resonant frequencies or modes 44, 46, and 48, that are above a lasing threshold 50 for gain from the lasing medium 15.

The optical path lengths L1 and L2 of the lasing and feedback cavities 12 and 14 are preferably related by an integer multiple, so that a plurality of modes in the lasing cavity 12 correspond to a plurality of modes in the feedback cavity 14. Angular settings of the diffraction grating 34 for the retroreflection of light at a mode of the feedback cavity 14 that also corresponds to a mode of the lasing cavity 12 allows light to be coupled between the lasing and feedback cavities 12 and 14 without significant loss of temporal coherence. Consequently, a resonance can be set up through an entire length L of the external cavity 18, where amplification gain is optimized within the lasing cavity 12 and amplification losses are minimized throughout the external cavity 18.

According to one example of a laser setup, the viable frequency span of the lasing cavity is regarded as approximately 5000 GHz wide having approximately 50 GHz intervals (mode spacing) favored for lasing within the lasing cavity 12. There are a total of around 100 intervals (modes) available within the lasing cavity 12 at which gain is sufficient for supporting lasing. In terms of wavelengths, approximately 780 through 790 nm of tuning are possible in approximately 0.1 nm increments. The feedback cavity modes are spaced by approximately 5 GHz intervals. The formula for the frequency span Δν between modes is as follows:

$$\Delta\nu = c/2OPL$$

where c is the speed of light and OPL is the optical path length between cavity facets (e.g., L1 or L2).

Thus, the optical path length L1 of the lasing cavity 12 is considered for this example at 3.0 mm and the optical path length L2 of the feedback cavity 14 is around 30 mm. The feedback cavity 14 is preferably longer than the lasing cavity 12 for providing finer adjustability to the frequency output of the laser 10 within a mode spacing tolerance of the lasing cavity 12.

By controlling the current and temperature of the laser 10, the modes (intervals Δν) remain evenly spaced and stable. Angular variation of the diffraction grating 34 allows the selection of a particular mode within the feedback cavity 14 associated with a desired lasing mode within the lasing cavity 12. The optical path length L2 of the feedback cavity and the optical path length L1 of the lasing cavity 12 are related so that modes of the lasing cavity 12 are spaced by equal increments of the spacing between modes of the feedback cavity 14. Preferably, a given number of modes in the feedback cavity 14 is associated with each of the modes of the lasing cavity 12, and the feedback cavity modes that most closely match the frequencies of the lasing cavity modes can be selected by angular positions of the diffraction grating 44 for safely distinguishing between the different lasing cavity modes.

The laser 10 can be tuned to the nearest lasing cavity mode frequency by positioning the diffraction grating 34 so that the nominal frequency returned from the grating 34 is within a band of frequencies associated with the feedback cavity mode that matches the nearest lasing cavity mode. At any one grating position, a limited range of frequencies are capable of return, and those frequencies subject to constructive interference by the feedback cavity (i.e., those closest to the modes of the feedback cavity) are favored for adjusting the loss (or gain) profile of the laser 10. The modes themselves have a limited range of variation, where the effective lengths of the standing waves 42 can vary according to design tolerances. Within the range of the design tolerances, the angular variations of the diffraction grating 34 through the non-matching feedback modes can be used to provide finer adjustments to the frequencies amplified within the lasing cavity 12.

A further stabilization among the modes with respect to such things as temperature or other such variations can be achieved by arranging the effects in one cavity (e.g., the lasing cavity 12) to cancel the effects in the other (e.g., the feedback cavity 14). For example, the effects could be of opposite signs in the two cavities 12 and 14. Alternatively, a change in the mode spacing of one of the cavities 12 or 14 can be matched by a corresponding change in the mode spacing of the other of the cavities 14 or 12 to provide similar control over the selection of slightly offset frequencies.

Figure 4:
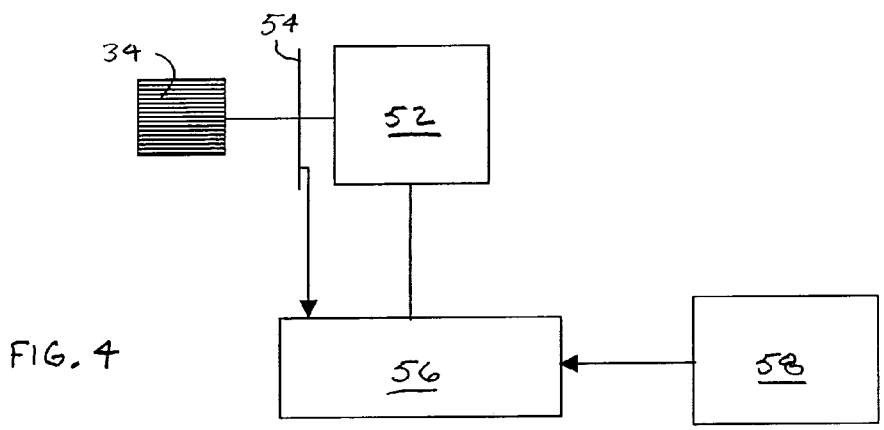
FIG. 4 is a diagram showing a control system for pivoting a diffraction grating.

As shown in FIG. 4, a motor 52 pivots the diffraction grating 34, and conventional feedback system 54 (e.g., a rotary encoder) is used in conjunction with a motor driver 56 for monitoring and controlling the rotational position of the motor 52 to effect the desired inclination of the diffraction grating 34 through angle θ. An optical feedback system 58 (e.g., a frequency analyzer) can also be used in conjunction with the motor driver 56 to control the motor 52 based on a measurement of the frequency output of the laser 10. An example of such a feedback system is disclosed in co-assigned US Application entitled OPTICAL FEEDBACK FROM MODE-SELECTIVE TUNER, filed on even date herewith and hereby incorporated by reference. Small variations in frequency within each lasing mode can be present as a function of design tolerances, and fine frequency selections can be made within the design tolerances by adjustments of the grating angle θ to output precise and repeatable frequencies associated with each lasing mode.

Figure 5:
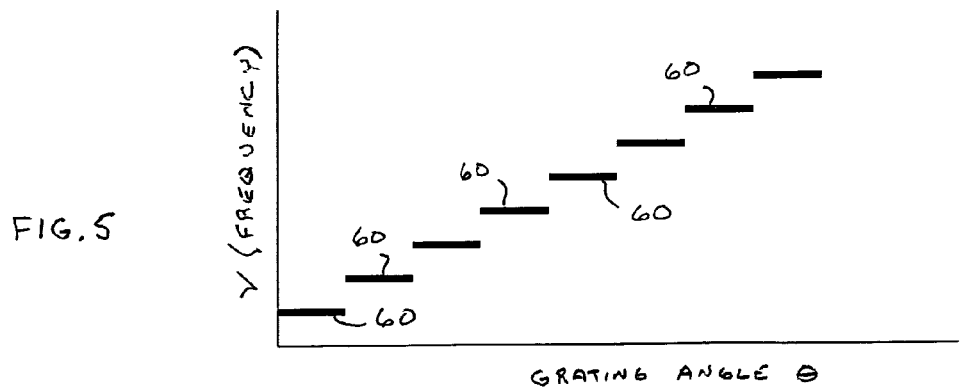
FIG. 5 is a simplified plot showing a frequency response over a domain of grating angles for lasing at distinct frequency modes.

A simplified graph of laser frequency output ν as a function of grating angle θ in FIG. 5 shows the dominate frequency output as confined to individual modes 60 of the lasing cavity. Some overlap between modes is possible at angular settings of the feedback modes that lie between the modes of the lasing cavity 12. However, this condition is easily avoided by angular settings of the diffraction grating 34 at which the feedback and lasing cavity modes more closely correspond.

The invention is particularly applicable to frequency-shifting interferometry in which distances, particularly surface height variations, are measured by producing a series of interference patterns at different measuring beam frequencies. The laser 10 supports the tuning of evenly spaced beam frequencies corresponding to the mode spacing or a multiple of the mode spacing of the lasing cavity. Frequency monitoring is simplified by limiting the measuring beam frequencies to certain frequency steps that can be monitored more easily than changes in beam frequencies over a continuum.

Although the invention has been described with respect to particular embodiments, those of skill in the art will appreciate that a wide range of variations can be made in the components, configurations, and tuning methods within the overall teaching of the invention. For example, the invention can be practiced with other types of lasers, including gas, dye, and solid-state lasers. The frequency adjustment can also be made in other ways while maintaining the fixed length L of the external cavity, such as by other forms of diffraction, refraction, or filtering.

The invention claimed is:

1. A frequency tuning system comprising:
a laser having both a lasing cavity and a feedback cavity along an optical axis;
the lasing cavity containing a lasing medium for amplifying a range of frequencies and having a first fixed optical path length along the optical axis;
the feedback cavity optically coupled to the lasing cavity and having a second fixed optical path length along the optical axis;
the lasing cavity favoring an amplification of frequencies that (a) are within the range of frequencies amplified by the lasing medium and (b) have integer numbers of wavelengths spanning a distance of two times the first optical path length of the lasing cavity;
the feedback cavity favoring the coupling of frequencies with the lasing cavity having integer numbers of wavelengths spanning a distance of two times the second optical path length of the feedback cavity;
at least some of the frequencies favored for amplification by the lasing cavity corresponding to the frequencies favored by the feedback cavity for coupling with the lasing cavity; and
a frequency adjuster that selects among the corresponding frequencies for shifting a frequency output of the laser through discrete frequency increments at the fixed optical path length of the feedback cavity.

2. The system of claim 1 in which the frequency adjuster includes a reflective facet that is pivotable about a pivot axis that intersects the optical axis of the feedback cavity.

3. The system of claim 2 in which the reflective facet includes a diffraction grating that angularly disperses incident light as a function of its frequency, and the frequency adjuster pivots the diffraction grating about the pivot axis for selectively reflecting different wavelengths along the optical axis.

4. The system of claim 1 further comprising an angularly sensitive optical coupling between the lasing and feedback cavities that favors the coupling of light directed along the optical axis.

5. The system of claim 4 in which the frequency adjuster includes a reflective facet at one end of the feedback cavity and the optical coupling is located at an opposite end of the feedback cavity.

6. The system of claim 5 in which the reflective facet angularly disperses incident light as a function of its frequency and is pivotable about a pivot axis that intersects the optical axis of the feedback cavity for relatively varying the frequency of light that is reflected back along the optical axis to the optical coupling.

7. The system of claim 1 in which the second optical path length of the feedback cavity is longer than the first optical path length of the lasing cavity by an integer multiple of the first optical path length.

8. The system of claim 1 in which the lasing cavity includes front and back facets, the front facet being located adjacent to the feedback cavity and exhibiting a reflectivity sufficient to favor the mode frequencies for amplification.

9. A frequency tuning system for a laser comprising:
an external cavity having a fixed optical path length;
the external cavity including optically coupled lasing and feedback cavities, each extending a fixed optical path length between opposite ends;
the lasing cavity containing a lasing medium;
the lasing and feedback cavities supporting oscillating modes in common corresponding to frequencies whose wavelengths are even divisions of two times their fixed optical path lengths of travel between the opposite ends of both of the cavities; and
a frequency adjuster that selects among the common oscillating modes without altering the fixed optical path length of the external cavity.

10. The system of claim 9 in which twice the optical path length of travel between opposite ends of the lasing cavity is a first integer multiple of one of the wavelengths of the common oscillating modes and twice the optical path length of travel between opposite ends of the feedback cavity is a second integer multiple of the same one of the wavelengths of the common oscillating modes.

11. The system of claim 10 in which one of the first and second integer multiples is an integer multiple of the other.

12. The system of claim 9 in which the feedback cavity includes an optical axis that extends between opposite ends and further comprising a frequency adjuster that includes a reflective facet that is located at one of the opposite ends and is adjustable without changing the optical path length of the external cavity.

13. The system of claim 12 in which the reflective facet spectrally disperses incident light and is adjustable for relatively varying the frequency of light that is reflected back along the optical axis toward the other of the opposite ends of the feedback cavity.

14. The system of claim 13 in which the frequency adjuster provides for pivoting the reflective facet about a pivot axis that intersects the optical axis of the feedback cavity.

15. The system of claim 14 in which the reflective facet includes a diffraction grating that reflects portions of the incident light through different diffraction orders.

16. The system of claim 9 further comprising a beam monitor for monitoring laser output as feedback for the frequency adjuster.

17. The system of claim 16 in which the beam monitor monitors the amplitude of the laser output to determine if an output frequency is among the desired oscillating modes of the lasing and feedback cavities.

18. The system of claim 16 in which the beam monitor monitors the frequency of the laser output to determine if an output frequency is among the desired oscillating modes of the lasing and feedback cavities.

19. The system of claim 9 further comprising a stabilizer for maintaining the fixed optical path length of the external cavity.

20. A method of incrementally tuning a laser through a set of mode-optimized frequencies comprising steps of:
powering a laser having an external cavity of a fixed optical path length;
oscillating light within both lasing and feedback portions of the external cavity at common oscillating modes corresponding to frequencies whose wavelengths are integer multiples of two times their optical path lengths of travel between opposite ends of both cavity portions;
selecting among the common oscillating modes for incrementally tuning the laser through a plurality of mode-optimized frequencies without altering the fixed optical path length of the external cavity.

21. The method of claim 20 in which the step of selecting includes adjusting a frequency that is reflected at one end of the external cavity.

22. The method of claim 21 in which the step of selecting includes pivoting a reflective facet about a pivot axis that intersects an optical axis of the external cavity for adjusting the reflected frequency without altering the fixed optical path length of the external cavity.

23. The method of claim 20 including a step of monitoring laser output as feedback for distinguishing the common oscillating modes from other laser output frequencies.

24. The method of claim 23 in which the step of monitoring includes monitoring the amplitude of the laser output to determine if an output frequency is among the common oscillating modes.

25. The method of claim 23 in which the step of monitoring includes monitoring the frequency of the laser output to determine if an output frequency is among the common oscillating modes.

26. The method of claim 20 comprising a step of adjusting environmental conditions affecting the external cavity for maintaining the fixed optical path length of the external cavity.

* * * * *